United States Patent

Moriya et al.

(10) Patent No.: US 12,060,635 B2
(45) Date of Patent: Aug. 13, 2024

(54) HARD MASK, SUBSTRATE PROCESSING METHOD, AND SUBSTRATE PROCESSING APPARATUS

(71) Applicant: Tokyo Electron Limited, Tokyo (JP)

(72) Inventors: Tsuyoshi Moriya, Tokyo (JP);
Tadahiro Ishizaka, Nirasaki (JP);
Yoshinori Morisada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 933 days.

(21) Appl. No.: 16/881,787

(22) Filed: May 22, 2020

(65) Prior Publication Data

US 2020/0370172 A1 Nov. 26, 2020

(30) Foreign Application Priority Data

May 23, 2019 (JP) .................. 2019-097156

(51) Int. Cl.
*B32B 9/00* (2006.01)
*C23C 16/27* (2006.01)
*C23C 16/455* (2006.01)
*G03F 1/00* (2012.01)
*H01L 21/311* (2006.01)

(52) U.S. Cl.
CPC ........ *C23C 16/27* (2013.01); *C23C 16/45536* (2013.01); *G03F 1/00* (2013.01); *H01L 21/31144* (2013.01)

(58) Field of Classification Search
CPC ......... Y10T 428/30; B82Y 30/00; G03F 1/00; C23C 16/26; C23C 16/27
USPC ......................................... 428/408
See application file for complete search history.

(56) References Cited

U.S. PATENT DOCUMENTS

2020/0235122 A1* 7/2020 Kang ................. H01L 21/7682

FOREIGN PATENT DOCUMENTS

| JP | H11-162995 A | 6/1999 |
| JP | 2017-224823 A | 12/2017 |
| KR | 2001-0058983 A | 7/2001 |
| KR | 10-2015-0141910 A | 12/2015 |

\* cited by examiner

*Primary Examiner* — Daniel H Miller
(74) *Attorney, Agent, or Firm* — Nath, Goldberg & Meyer; Jerald L. Meyer; Tanya E. Harkins (57) ABSTRACT

In a hard mask formed on a target film formed on a substrate, a first film having a stress in a first direction and a second film having a stress in a second direction opposite to the first direction are alternately stacked one or more times.

7 Claims, 10 Drawing Sheets

HARD MASK, SUBSTRATE PROCESSING METHOD, AND SUBSTRATE PROCESSING APPARATUS

CROSS-REFERENCE TO RELATED APPLICATION(S)

This application is based upon and claims the benefit of priority from Japanese Patent Application No. 2019-097156, filed on May 23, 2019, the entire contents of which are incorporated herein by reference.

TECHNICAL FIELD

The present disclosure relates to a hard mask, a substrate processing method, and a substrate processing apparatus.

BACKGROUND

For example, a technique of using a hard mask containing carbon as an etching mask is known.

Patent Document 1 discloses a substrate processing method that includes: depositing a device layer on a processing surface of a substrate; depositing a nanocrystalline diamond layer on the device layer; patterning and etching the nanocrystalline diamond layer; etching the device layer to form a channel; and ashing the nanocrystalline diamond layer.

PRIOR ART DOCUMENT

Patent Document

Patent Document 1: Japanese laid-open publication No. 2017-224823

SUMMARY

According to an aspect of the present disclosure, there is provided a hard mask formed on a target film formed on a substrate, wherein a first film having a stress in a first direction and a second film having a stress in a second direction opposite to the first direction are alternately stacked one or more times in the hard mask.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the drawings, like components are denoted by like reference numerals and a repeated description thereof will be omitted.

<Substrate Processing System>

Figure 1:
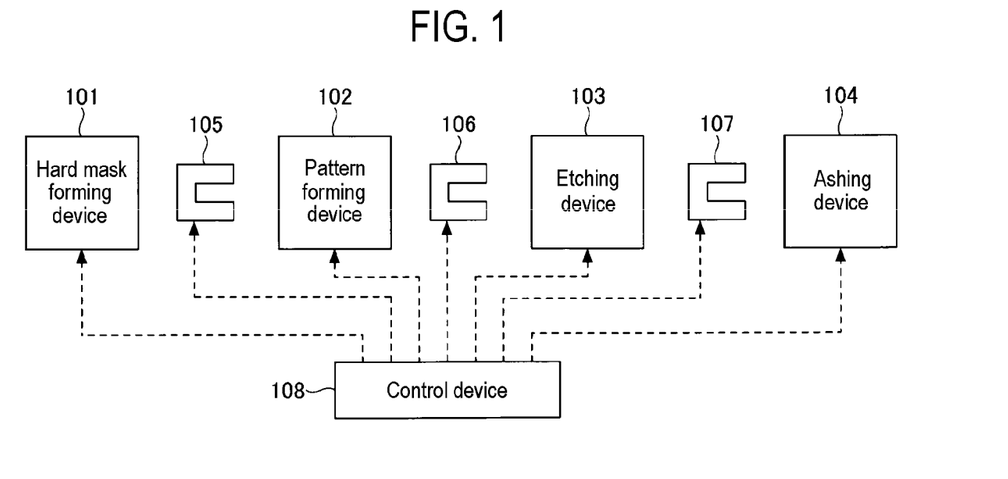
FIG. 1 is a schematic configuration view illustrating an example of a substrate processing system according to an embodiment.

A substrate processing system 100 according to an embodiment of the present disclosure will be described with reference to FIG. 1. FIG. 1 is a schematic configuration view illustrating an example of the substrate processing system 100 according to the present embodiment.

The substrate processing system 100 includes a hard mask forming device 101, a pattern forming device 102, an etching device 103, an ashing device 104, transfer devices 105 to 107, and a control device 108.

The hard mask forming device 101 is a device which forms a hard mask 220 (see FIG. 5B as described later) on a target film 210 (see FIG. 5A as described later) formed on a processing surface of a substrate W. Details of the hard mask forming device 101 will be described later.

The pattern forming device 102 is a device which forms a pattern 230 (see FIG. 5C described later) on the hard mask 220. Furthermore, the pattern forming device 102 is configured to perform, for example, a process of forming a photoresist layer (not shown) on the hard mask 220, a lithography process of developing a pattern on the photoresist layer, and a process of etching the hard mask 220 via the photoresist layer on which the pattern is formed, so as to form the pattern 230 on the hard mask 220. Further, a known device may be used as the device for performing these processes, and therefore, a detailed description thereof will be omitted.

The etching device 103 is a device which etches the target film 210 via the hard mask 220 on which the pattern 230 is formed, so as to form a feature structure 240 such as a trench, a channel, a hole, or the like in the target film 210. A known device may be used as the etching device 103, and therefore, a detailed description thereof will be omitted. Furthermore, the etching process may be performed by a wet process or a dry process, but is not limited thereto.

The ashing device 104 is a device which removes the hard mask 220 from the substrate W by an ashing process. A device for ashing the hard mask 220 with, for example, oxygen plasma, may also be used as the ashing device 104. A known device may be used as the ashing device 104, and therefore, a detailed description will be omitted.

The transfer device 105 transfers the substrate W or a carrier accommodating the substrate W between the hard mask forming device 101 and the pattern forming device 102. The transfer device 106 transfers the substrate W or a carrier accommodating the substrate W between the pattern forming device 102 and the etching device 103. The transfer device 107 transfers the substrate W or a carrier accommodating the substrate W between the etching device 103 and the ashing device 104.

The control device 108 controls the overall process performed by the substrate processing system 100 by controlling each of the constituent devices. The control device 108 has a central processing unit (CPU), a read only memory (ROM), and a random access memory (RAM). The CPU executes a desired process according to a recipe stored in a storage area such as the RAM or the like. A process time, various gas flow rates, a pressure (for gas exhaust), and the like, which are control information of the devices for process conditions, are set in the recipe.

<Hard Mask Forming Device>

Figure 2:
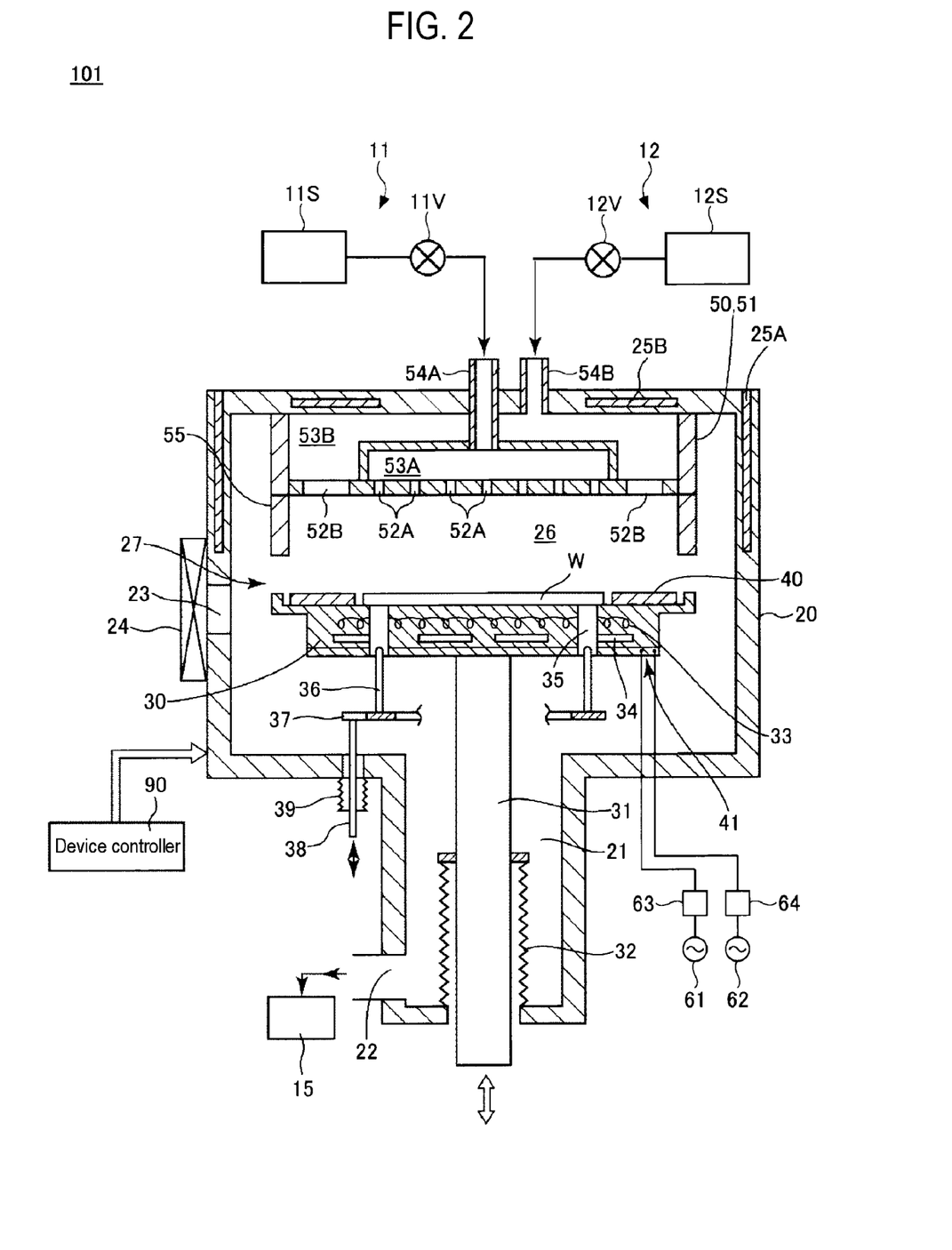
FIG. 2 is a schematic cross-sectional view illustrating an example of a hard mask forming device according to an embodiment.

Next, the hard mask forming device 101 will be described with reference to FIGS. 2 and 3. FIG. 2 is a schematic cross-sectional view illustrating an example of the hard mask forming device 101 according to the present embodiment.

The hard mask 220 (see FIG. 5B described later) formed by the hard mask forming device 101 according to the present embodiment is configured as a stacked film in which a first film 221 and a second film 222 are alternately stacked one or more times. The hard mask forming device 101 has a first gas supply system 11 for supplying a source gas for the first films 221 and a second gas supply system 12 for supplying a source gas for the second films 222. The hard mask forming device 101 is, for example, a chemical vapor deposition (CVD) device, and forms the hard mask 220 in which the first film 221 and the second film 222 are alternately stacked one or more times by forming the films while switching the source gases. The first gas supply system 11 has a source gas source 11S and a valve 11V. The second gas supply system 12 has a source gas source (precursor evaporating device) 12S and a valve 12V. By controlling opening and closing of the valves 11V and 12V, the source gases supplied to a processing space 26 can be switched.

The hard mask forming device 101 has a cylindrical process vessel 20. The process vessel 20 has an upper chamber with a large inner diameter and a lower chamber with an inner diameter smaller than that of the upper chamber. The interior of the lower chamber is formed as an exhaust space 21. An exhaust port 22 is formed in a lower sidewall which partitions the exhaust space 21. An exhaust system 15 configured to exhaust an internal atmosphere of the process vessel 20 is connected to the exhaust port 22. The exhaust system 15 has a vacuum pump or the like, and can control an internal pressure of the process vessel 20 to a predetermined pressure.

An opening 23 for loading and unloading the substrate W is formed in a sidewall of the process vessel 20. In addition, a gate valve 24 for opening and closing the opening in an airtight manner is provided in the opening 23.

Heaters 25A and 25B are provided in a sidewall and a ceiling portion of the process vessel 20, respectively. The heaters 25A and 25B prevent the source gases from being solidified or liquefied by heating and maintaining the sidewall and the ceiling portion of the process vessel 20 at a predetermined temperature.

In addition, a stage 30 for mounting and holding the substrate W as a processing target is provided in the upper chamber of the process vessel 20. The substrate W is mounted on an upper surface of the stage 30. A lower surface of the stage 30 is fixed to an upper end portion of a support 31. The support 31 extends vertically through a bottom portion defining the exhaust space 21. The support 31 is moved upward and downward by an actuator (not shown). Accordingly, the stage 30 can be moved upward and downward so that the stage 30 can be stopped at an arbitrary position in the vertical direction. In addition, an expandable metallic bellows 32 is provided at a penetration portion through which the support 31 penetrates the process vessel 20, so as to allow the stage 30 to be moved upward and downward while maintaining airtightness in the process vessel 20.

A heater 33 is provided at an upper portion of the stage 30. The heater 33 heats the stage 30 so as to heat the substrate W mounted on the stage 30. Furthermore, a coolant passage 34, through which a coolant such as cooling water for adjusting the temperature of the lower portion and the side portion of the stage 30 by cooling the lower portion and the side portion of the stage 30 flows, is provided at a lower portion of the stage 30.

In addition, a plurality of (only two are illustrated in FIG. 2) pin insertion through holes 35 are provided in a peripheral portion of the stage 30. Lifter pins 36 are inserted into and penetrate the pin insertion through holes 35. Lower end portions of the lifter pins 36 are supported by a lifting arm 37. The lifting arm 37 is fixed to a lifting rod 38. The lifting rod 38 extends vertically through the bottom portion of the process vessel 20. The lifting rod 38 is moved upward and downward by an actuator (not shown). Accordingly, the lifter pins 36 can be moved upward and downward. For example, by making the lifter pins 36 protrude from the stage 30 in a state where the stage 30 has been moved downward, the lifter pins 36 can support the substrate W and lift the substrate W up from the upper surface of the stage 30. Furthermore, by moving the lifter pins 36 downward in a state where the lifter pins 36 support the substrate W, the substrate W can be mounted on the upper surface of the stage 30. In addition, an expandable metallic bellows 39 is provided at a penetration portion through which the lifting rod 38 penetrates the process vessel 20, so as to allow the lifter pins 36 to be moved upward and downward while maintaining the airtightness in the process vessel 20.

A cover ring 40 is provided on an outer peripheral portion of the upper surface of the stage 30 so as to prevent a film from adhering to a bevel portion of the substrate W.

In addition, a gas introducer 50 for introducing necessary gases is provided at the ceiling portion of the process vessel 20 so as to face the stage 30. Specifically, the gas introducer 50 is configured by a shower head 51. A plurality of gas inlets 52A are formed on a lower surface of the shower head 51 so as to face the substrate W on the stage 30. In addition, a gas inlet 52B is formed so as to surround a region in which the gas inlets 52A are formed. The inside of the shower head 51 is partitioned into two spaces so as to define diffusion chambers 53A and 53B. The diffusion chamber 53A is in communication with the gas inlets 52A. The diffusion chamber 53B is in communication with the gas introducing inlet 52B. A gas inlet 54A in communication with the diffusion chamber 53A and a gas inlet 54B in communication with the diffusion chamber 53B are formed in the ceiling portion of the process vessel 20. The gas inlet 54A is connected to the first gas supply system 11. The gas inlet 54B is connected to the second gas supply system 12.

A sidewall portion of the shower head 51 further extends downward so as to provide a ring-shaped inner partition wall 55. The inner partition wall 55 is provided so as to surround the periphery of the processing space 26 above the stage 30, and a lower end portion of the inner partition wall 55 approaches the stage 30. In addition, a gas outlet 27 for gas exhaust is formed between the lower end portion of the inner partition wall 55 and the peripheral edge portion of the stage 30. The gas outlet 27 is formed in an annular shape along the circumferential direction of the stage 30 so that the atmosphere of the processing space 26 is uniformly exhausted from the outer peripheral side of the substrate W through the gas outlet 27.

By opening the valve 11V, the source gas of the source gas source 11S is introduced into the processing space 26 from the gas inlets 52A via the gas inlet 54A and the diffusion chamber 53A. Similarly, by opening the valve 12V, the source gas of the source gas source 12S is introduced into the processing space 26 from the gas inlet 52B via the gas inlet 54B and the diffusion chamber 53B. Thereafter, the atmosphere of the processing space 26 is exhausted to the exhaust system 15 via the gas outlet 27, the exhaust space 21, and the exhaust port 22.

The stage 30 has a lower electrode plate 41, and serves as a lower electrode provided below the substrate W. Furthermore, the shower head 51 serves as an upper electrode provided above the substrate W.

The substrate processing system 100 includes a first high frequency power source 61 and a second high frequency power source 62. The first high frequency power source 61 is a power source which generates a first high frequency power. The first high frequency power has a frequency suitable for generating plasma. The frequency of the first high frequency power is, for example, in a range of 12.88 MHz to 220 MHz. The first high frequency power source 61 is connected to the lower electrode via a matching device 63. The matching device 63 has a circuit for matching an output impedance of the first high frequency power source 61 with an impedance on a load side (lower electrode side). The first high frequency power source 61 may be connected to the upper electrode via the matching device 63. The first high frequency power source 61 constitutes a plasma generator as an example.

The second high frequency power source 62 is a power source which generates a second high frequency power. The second high frequency power has a frequency lower than the frequency of the first high frequency power. When the second high frequency power is used together with the first high frequency power, the second high frequency power is used as a bias high frequency power for drawing ions into the substrate W. The frequency of the second high frequency power is, for example, in a range of 400 kHz to 13.56 MHz. The second high frequency power source 62 is connected to the lower electrode via a matching device 64. The matching device 64 has a circuit for matching an output impedance of the second high frequency power source 62 with an impedance on the load side (lower electrode side). The second high frequency power source 62 constitutes a plasma generator as an example.

A gas is introduced into the processing space 26 from the gas introducer 50 to generate plasma. Furthermore, a high frequency electric field is generated between the upper electrode and the lower electrode by supplying the first high frequency power and/or the second high frequency power. The generated high frequency electric field generates plasma.

A device controller 90 controls the valves 11V and 12V, the vacuum pump of the exhaust system 15, the gate valve 24, the heaters 25A and 25B, the heater 33, the actuator of the support 31, the actuator of the lifting rod 38, and the like, so as to control the overall process performed by the hard mask forming device 101. The device controller 90 has a central processing unit (CPU), a read only memory (ROM), and a random access memory (RAM). The device controller 90 executes a desired process based on commands from the control device 108.

Here, the first film 221 is, for example, a carbon film, and a carbon-containing gas (e.g., $CH_4$, $C_2H_2$, $C_2H_4$, $C_3H_6$, or the like) may be used as the source gas supplied by the first gas supply system 11. Furthermore, the second film 222 is, for example, a Ru film, and a Ru-containing gas (e.g., $Ru_3(CO)_{12}$ or the like) may be used as the source gas supplied by the second gas supply system 12. Here, $Ru_3(CO)_2$, which is a precursor of the second film 222, is a solid substance at room temperature, and the source gas source 12S gasifies $Ru(CO)_{12}$ and supplies it to the gas inlet 54B.

Figure 3:
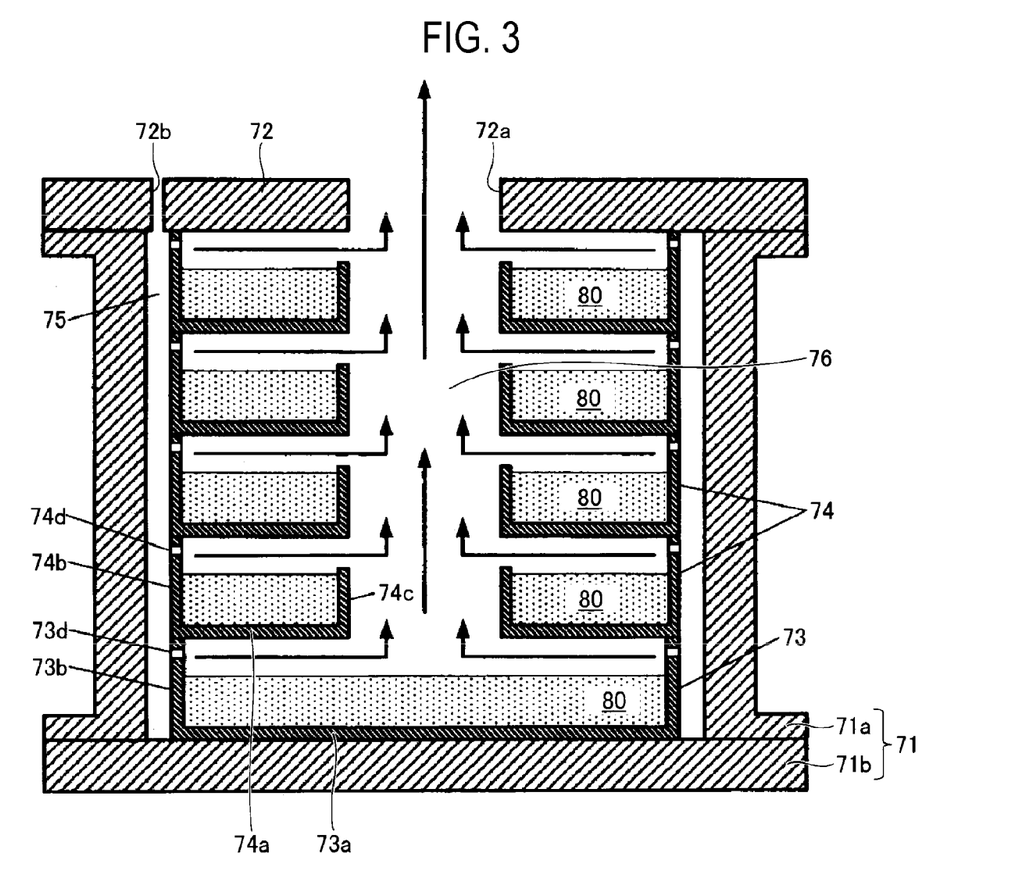
FIG. 3 is a schematic cross-sectional view illustrating an example of a precursor evaporating device according to an embodiment.

FIG. 3 is a schematic cross-sectional view illustrating an example of the source gas source (precursor evaporating device) 12S.

The precursor evaporating device 12S has a vessel 71 with an outer wall 71a and a bottom portion 71b. In addition, the precursor evaporating device 12S has a lid 72 configured to be airtightly bonded to the vessel 71. The lid 72 has an outlet 72a. The outlet 72a is connected to the gas inlet 54B (see FIG. 2).

The vessel 71 has a base tray 73 and upper trays 74 therein. The base tray 73 has a disc-shaped bottom plate 73a and an outer wall 73b formed along an outer periphery of the bottom plate 73a, and holds a solid precursor 80 inside the outer wall 73b. The upper tray 74 has a perforated disc-shaped bottom plate 74a, an outer wall 74b formed along an outer periphery of the bottom plate 74a, and an inner wall 74c formed along an inner periphery of the bottom plate 74a. The upper tray 74 holds the solid precursor 80 between the outer wall 74b and the inner wall 74c. The height of the inner wall 74c is lower than the height of the outer wall 74b. The base tray 73 is provided on the bottom portion 71b of the vessel 71. The outer wall 73b of the base tray 73 is in contact with the bottom plate 73a of the upper tray 74, so that the base tray 73 and the upper tray 74 are stacked. Furthermore, the outer wall 74b of the upper tray 74 is in contact with the bottom plate 73a of another upper tray 74, so that the upper trays 74 are stacked. Thus, an annular space 75 is formed between the outer wall 71a of the vessel 71 and the outer walls 73b and 74b of the stacked base tray 73 and the upper trays 74. In addition, a columnar space 76 is formed by the inner walls 74c of the stacked upper trays 74.

An opening 73d is formed in the outer wall 73b of the base tray 73. In addition, an opening 74d is formed in the outer wall 74b of the upper tray 74. An opening 72b for supplying a carrier gas to the annular space 75 is provided in the lid 72.

The precursor evaporating device 12S includes a heater (not shown), and heats the solid precursors 80 held on the base tray 73 and the upper trays 74 to a predetermined temperature. Thus, a gas phase of the precursors 80 is formed.

The carrier gas supplied from the opening 72b flows into the annular space 75, and then flows into the openings 73d and 74d of the outer walls 73b and 74b. The gas phase of the precursors 80 is transferred by the carrier gas flowing from the openings 73d and 74d to the columnar space 76, exhausted from the outlet 72a of the lid 72, and supplied to the gas inlet 54B (see FIG. 2). The precursor 80 is, for example, $Ru_3(CO)_{12}$. The carrier gas is, for example, a mixed gas of Ar, which is an inert gas, and a CO gas, which is a gas for suppressing a film-forming reaction of $Ru_3(CO)$ $_{12}$. As described above, the precursor evaporating device 12S gasifies and supplies $Ru_3(CO)_{12}$ to the gas inlet 54B.

<Operation of Substrate Processing System 100>

Figure 4:
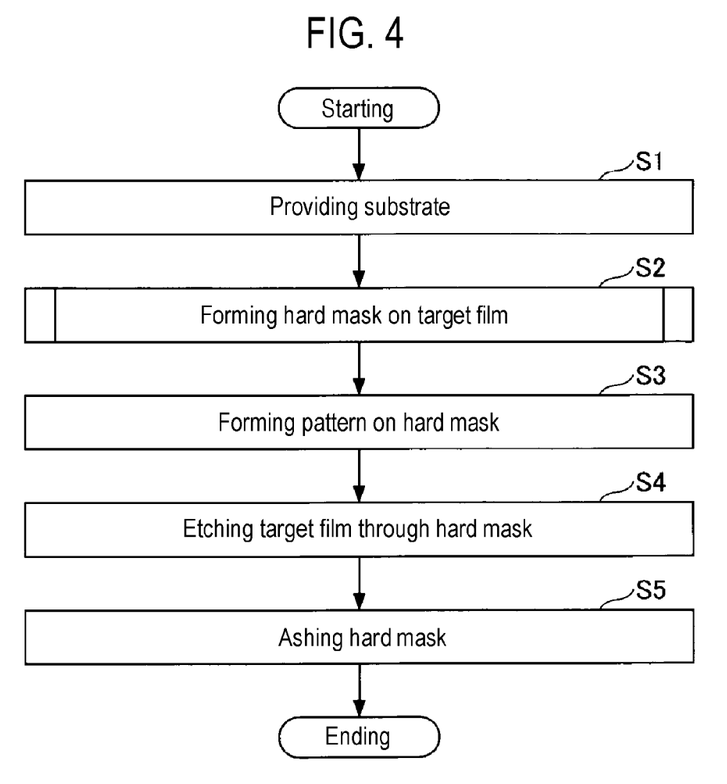
FIG. 4 is a flowchart illustrating an example of an operation of the substrate processing system according to an embodiment.

Next, an example of an operation of the substrate processing system 100 according to the present embodiment will be described with reference to FIGS. 4 to 5E. FIG. 4 is a flowchart illustrating an example of an operation of the substrate processing system 100 according to the present embodiment. FIGS. 5A to 5E are schematic cross-sectional views of a substrate W at respective processes.

First, at S1, the control device 108 provides the substrate W. The control device 108 controls a transfer device (not shown) so as to mount the substrate W on the stage 30 of the hard mask forming device 101. When the transfer device is retreated from the opening 23, the control device 108 closes the gate valve 24.

Figure 5A:
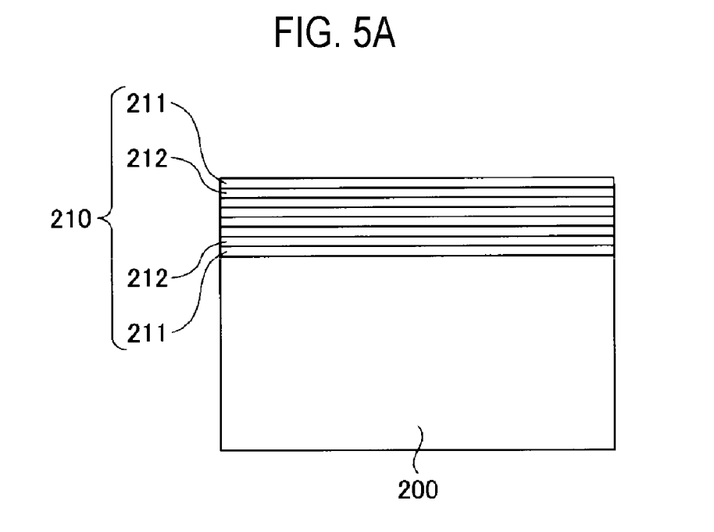
FIGS. 5A to 5E are schematic cross-sectional views of a substrate at respective processes.

A schematic cross-sectional view of the substrate W mounted on the stage 30 is illustrated in FIG. 5A. As illustrated in FIG. 5A, the substrate W has the target film 210 formed on a Si substrate 200. The target film 210 is formed of, for example, a stacked film in which a silicon nitride film 211 and a silicon oxide film 212 are alternately stacked. Further, in FIG. 5A, the lowermost layer film is illustrated as the silicon nitride film 211, but is not limited thereto and may be the silicon oxide film 212. Also, the uppermost layer film is illustrated as the silicon nitride film 211, but is not limited thereto and may be the silicon oxide film 212. Furthermore, the target film 210 is not limited to the above described film. For example, the target film 210 may be an amorphous silicon film, a tungsten film, or a titanium nitride film, but is not limited thereto.

At S2, the control device 108 controls the hard mask forming device 101 so as to form the hard mask 220 on the target film 210 of the substrate W.

Figure 5B:
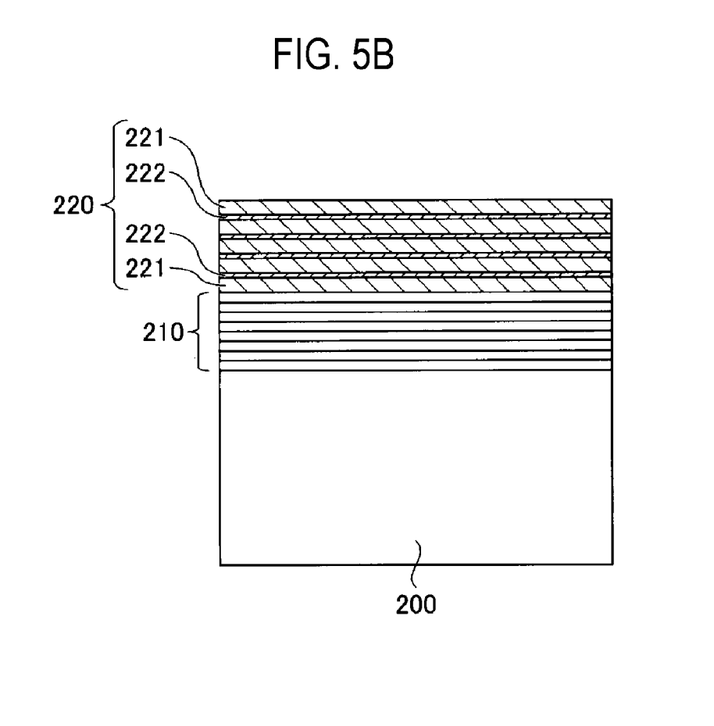

A schematic cross-sectional view of the substrate W on which the hard mask 220 is formed is illustrated in FIG. 5B. As illustrated in FIG. 5B, the hard mask 220 is configured as a stacked film in which the first film 221 having a stress in a first direction and the second film having a stress in a second direction opposite to the first direction are alternately stacked one or more times. For the first film 221 and the second film 222, material having a relatively good etching selectivity with respect to the target film 210 is used. That is, the selectivities of the first film 221 and the second film 222 with respect to the target film 210 are greater than 1. Thus, the feature structure 240 having a high aspect ratio can be formed during an etching process to be described later (see S4).

In the following description, the first film 221 is described as being a carbon film. Furthermore, a diamond like carbon (DLC) film, for example, may be used as the carbon film. The DLC film has a compressive stress. In addition, the second film 222 will be described as being a Ru film. The Ru film has a tensile stress.

Figure 6:
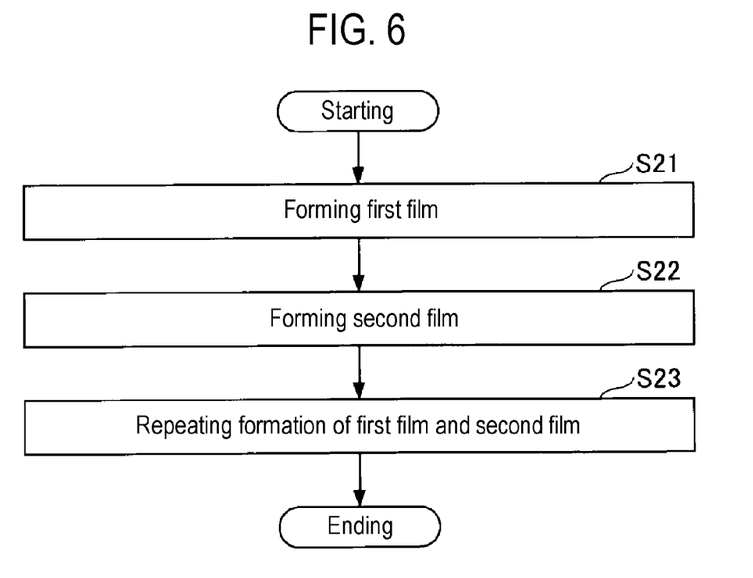
FIG. 6 is a flowchart illustrating an operation of the hard mask forming device according to an embodiment.
Figure 7A:
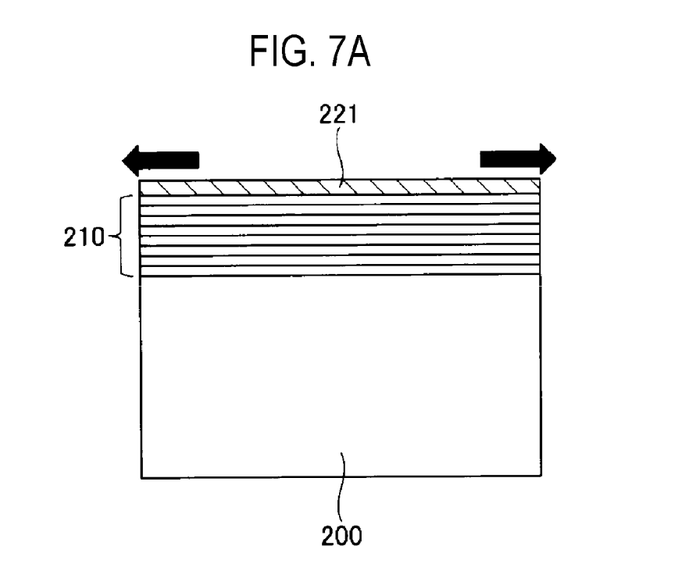
FIGS. 7A and 7B are schematic cross-sectional views of a substrate at respective steps of forming a hard mask.
Figure 7B:
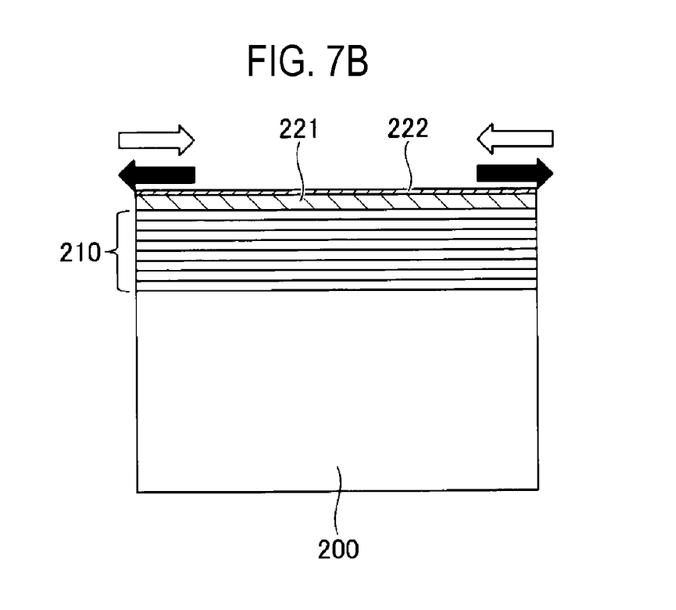

An operation of the hard mask forming device 101 at S2 will be further described with reference to FIGS. 6 to 7B. FIG. 6 is a flowchart illustrating an operation of the hard mask forming device 101 according to an embodiment. FIGS. 7A and 7B are schematic cross-sectional views of the substrate W at respective processes of forming a hard mask.

At S21, the control device 108 controls the hard mask forming device 101 so as to form the first film 221 on the target film 210 of the substrate W by a plasma CVD process.

The device controller 90, which operates according to commands from the control device 108, controls the heater 33 so as to set the temperature of the substrate W to a predetermined temperature. Further, the device controller 90 controls the exhaust system 15 so as to set the processing space 26 to a predetermined pressure. In addition, the device controller 90 opens the valve 11V so as to supply a source gas to the processing space 26. Furthermore, the device controller 90 operates the first high frequency power source 61 for plasma generation and the second high frequency power source 62 for bias so as to generate plasma.

An example of the recipe may be as follows:
Supply gas: $CH_4$, $C_2H_2$, $C_2H_4$, $C_3H_6$, $H_2$, Ar, He, $O_2$
Carrier gas: $H_2$, Ar, He, $O_2$
Gas flow rate: 2,000 sccm
Temperature of the stage: 100 to 550 degrees C. (substrate W: to 370 degrees C.)
Internal pressure of the process vessel: 2 to 500 Pa
First high frequency power: 100 MHz
Second high frequency power: 13.56 MHz.

By the recipe as described above, the DLC film (first film 221) is formed on the substrate W by a plasma CVD process. Here, as illustrated in FIG. 7A, the DLC film (first film 221) has a compressive stress (indicated by black arrows in the drawing).

At S22, the control device 108 controls the hard mask forming device 101 so as to form the second film 222 on the first film 221 of the substrate W by a thermal CVD process.

The device controller 90, which operates according to commands from the control device 108, controls the heater 33 so as to set the temperature of the substrate W to a predetermined temperature. Further, the device controller 90 controls the exhaust system 15 so as to set the processing space 26 to a predetermined pressure. In addition, the device controller 90 opens the valve 12V so as to supply a source gas to the processing space 26.

An example of the recipe may be as follows:
Supply gas: $Ru_3(CO)_{12}$
Carrier gas: Ar+CO
Gas flow rate: CO 100 sccm
Temperature of the stage: 150 degrees C.
International pressure of the process vessel: 0.01 Torr.

By the recipe as described above, $Ru_3(CO)_{12}$ is pyrolyzed on the surface of the substrate W such that the Ru film (second film 222) is formed on the substrate W. Here, as illustrated in FIG. 7B, the Ru film (second film 222) has a tensile stress (indicated by white arrows in the drawing).

At S23, the control device 108 controls the hard mask forming device 101 so as to repeat the formation of the first film 221 and the second film 222 on the substrate W. When a predetermined number of stacking is completed, the process illustrated in FIG. 6 is completed.

As described above, by stacking the first film 221 and the second film 222 having stresses in opposite directions to each other to form the hard mask 220, a stress of the hard mask 220 can be adjusted. For example, the stress of the hard mask 220 may be adjusted such that warping of the substrate W due to the stress of the hard mask 220 is reduced.

When the formation of the hard mask 220 in the hard mask forming device 101 is completed, the control device 108 controls the transfer device 105 so as to transfer the substrate W from the hard mask forming device 101 to the pattern forming device 102.

Returning to FIGS. 4 to 5E, at S3, the control device 108 controls the pattern forming device 102 so as to form the pattern 230 on the hard mask 220 of the substrate W. First, a photoresist layer (not shown) is formed on the hard mask 220. Here, an anti-reflection layer (not shown) may be provided between the hard mask 220 and the photoresist layer. Next, the photoresist layer is patterned as desired.

Figure 5C:
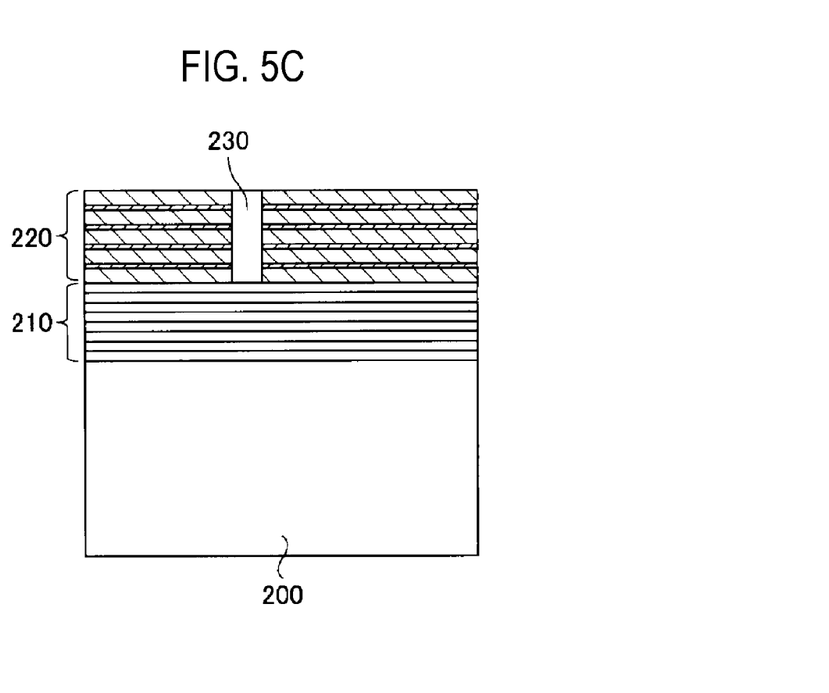

After developing the photoresist, the hard mask 220 exposed below the pattern is removed. Thus, as illustrated in FIG. 5C, the opening pattern 230 is formed in the hard mask 220.

When the formation of the pattern 230 in the pattern forming device 102 is completed, the control device 108 controls the transfer device 106 so as to transfer the substrate W from the pattern forming device 102 to the etching device 103.

Figure 5D:
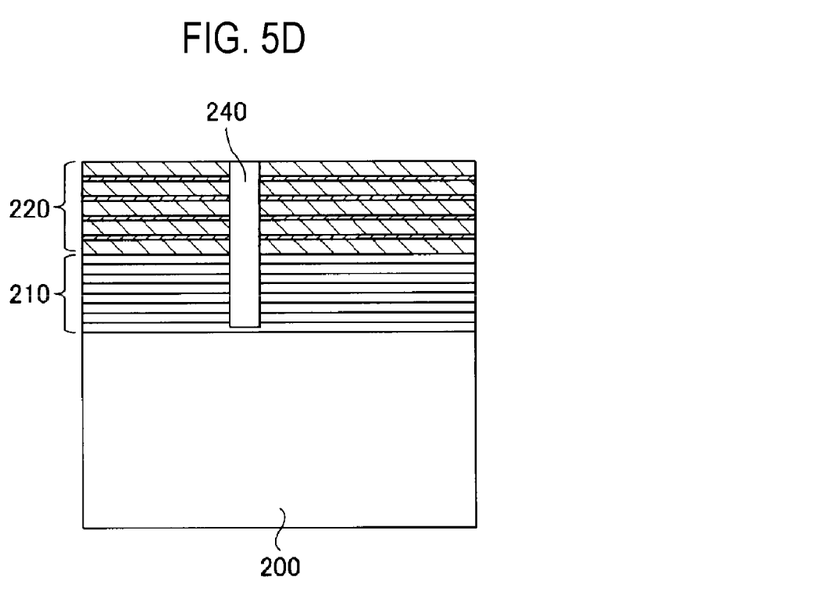
Figure 5E:
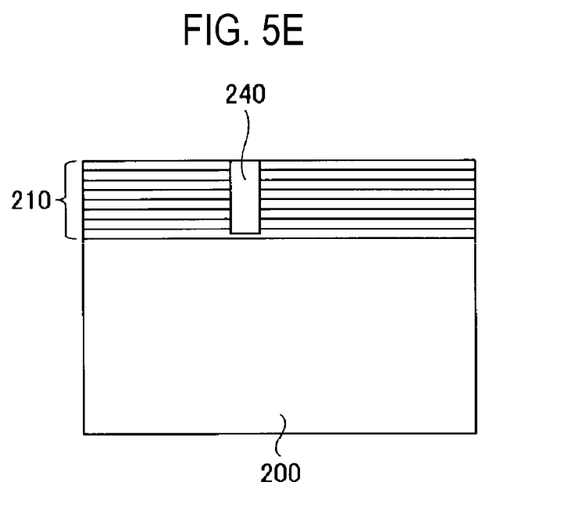

At S4, the control device 108 controls the etching device 103 so as to etch the target film 210 via the opening pattern 230 of the hard mask 220 of the substrate W. Thus, as illustrated in FIG. 5D, the feature structure 240 such as a trench, a channel, a hole, or the like is formed in the target film 210. Here, the hard mask 220 (the first films 221 and the second films 222) has a relatively high etching selectivity with respect to the target film 210. That is, the selection ratio of the hard mask 220 with respect to the target film 210 is greater than 1. Thus, the feature structure 240 having a high aspect ratio can be formed in the target film 210.

When the etching process performed in the etching device 103 is completed, the control device 108 controls the transfer device 107 so as to transfer the substrate W from the etching device 103 to the ashing device 104.

At S5, the control device 108 controls the ashing device 104 to ash the hard mask 220 of the substrate W.

The ashing device 104 herein includes a heater which heats the substrate W held in the processing space. The heater heats the substrate W to a predetermined temperature (for example, higher than a sublimation temperature of $Ru(CO)_{12}$ and lower than a thermal decomposition temperature of $Ru_3(CO)_{12}$). In addition, the ashing device 104 includes a plasma generation device which generates oxygen plasma. The plasma generation device generates oxygen plasma in the processing space in which the substrate W is held. Thus, the DLC film as the first film 221 is ashed with oxygen plasma as expressed by the following chemical formula. In the following chemical formula, the symbol "↑" indicates a gas.

$$C+O^* \rightarrow CO\uparrow$$

Furthermore, the Ru film as the second film 222 is ashed with CO generated when the DLC film is ashed as expressed by the following chemical formula. A CO gas may also be supplied to the processing space of the ashing device 104 in order to promote ashing the Ru film.

$$3Ru+12CO \rightarrow Ru_3(CO)_{12}\uparrow$$

As described above, the ashing device 104 can remove both the stacked first films 221 and second films 222 by the ashing process using the oxygen plasma.

When the removal of the hard mask 220 in the ashing device 104 is completed, the control device 108 controls the transfer device 107 so as to discharge the substrate W.

According to the substrate processing system 100 of the present embodiment described above, it is possible to control the stress of the hard mask 220 by forming the hard mask 220 by stacking the DLC film (the first film 221) having a compressive stress and the Ru film (the second film 222) having a tensile stress. For example, it is possible to reduce the stress of the hard mask 220 compared with a case where the hard mask is formed of the DLC film only.

Figure 8:
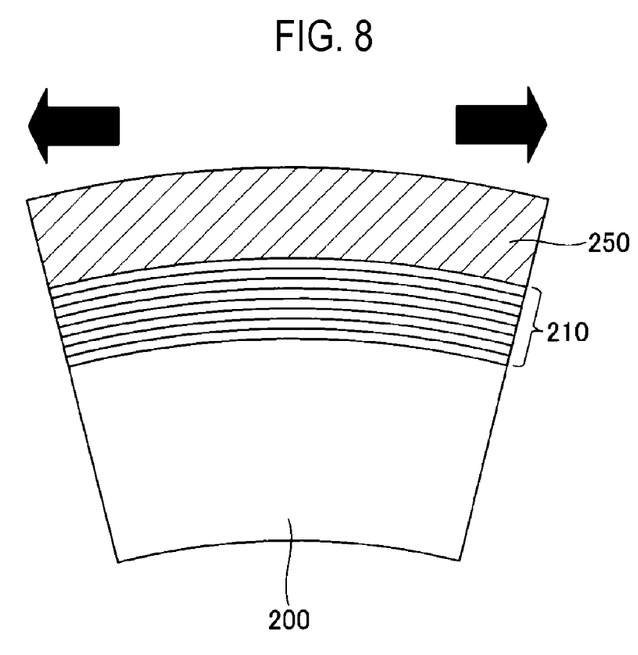
FIG. 8 is a schematic cross-sectional view of a substrate on which a hard mask according to a comparative example is formed.

FIG. 8 is a schematic cross-sectional view of a substrate W on which a hard mask according to a comparative example is formed. The hard mask according to the comparative example is formed of a DLC film 250 only. As illustrated in FIG. 8, the substrate W is warped by a compressive stress of the DLC film 250. Due to the warping of the substrate W, there is a concern that focusing may not be accurate in the lithography process at S3, for example, and a desired pattern may not be obtained. In contrast, according to the hard mask forming device 101 of the present embodiment, it is possible to form the hard mask 220 having a small stress, for example. Thus, it is possible to suppress the warping of the substrate W, and to appropriately set the focus in the lithography process. That is, the fine pattern 230 can be formed on the hard mask 220.

In some embodiments, the temperature of the substrate W may be kept constant at S21 to S23 of forming the first films 221 and the second films 222. In this case, since the time for raising and lowering the temperature of the substrate W can be eliminated, it is possible to improve productivity of the hard mask 220.

In some embodiments, the temperature of the substrate W at S21 of forming the first film 221 and the temperature of the substrate W at S22 of forming the second film 222 may be identical to each other. Since responsiveness of a temperature control of the substrate W is slower than other responsiveness (for example, responsiveness of a pressure control in the processing space 26 or responsiveness of a gas switching), when the temperatures of the substrate W at S21 and S22 are different from each other, a time taken for stacking the hard mask 220 is increased. In contrast, in the present embodiment, by using $CH_4H_2$ in forming the carbon film (first film 221) and using $Ru_3(CO)_{12}$ in forming the Ru film (second film 222), the first film 221 and the second film 222 can be formed with the temperature of the substrate W kept constant at 200 degrees C. Thus, it is possible to improve productivity of the hard mask 220.

In some embodiments, in the process of ashing the hard mask 220, both the first films 221 and the second films 222 may be ashed with oxygen plasma. Since the metal component (Ru) of the second film 222 can be also ashed with CO generated when the first film (DLC film) 221 is ashed, it is possible to suitably remove the metal component (Ru) from the substrate W.

In some embodiments, the uppermost layer film of the hard mask 220 may be a carbon film (first film 221). In this case, even when the transfer of the substrate W by the transfer devices 105 to 107 is performed in an atmospheric atmosphere, for example, it is possible to prevent natural oxidation of the Ru film (second film 222), which is a metal film.

In some embodiments, the lowermost layer film of the hard mask 220 may be the first film 221 (carbon film) having a compressive stress. In this case, since the first film 221 in direct contact with the target film 210 has a compressive stress, it is possible to improve adhesion between the target film 210 and the first film 221. Thus, it is possible to prevent film delamination of the hard mask 220.

In some embodiments, the lowermost layer film of the hard mask 220 may be a carbon film (first film 221). In this case, the Ru film (second film 222), which is a metal film, is not formed directly on the target film 210, and it is possible to reduce impurities remaining on the target film 210 during the ashing process (S5).

In addition, although the carbon film (first film 221) is described as being formed by a plasma CVD process, the present disclosure is not limited thereto. The carbon film (first film 221) may be formed by a thermal CVD process or a physical vapor deposition (PVD) process. Further, although the Ru film (second film 222) is described as being formed by a thermal CVD process, the present disclosure is not limited thereto. The Ru film (second film 222) may be formed by a plasma CVD process or a PVD process.

Although the gas for forming the first film 221 has been described using a carbon-containing gas (e.g., $CH_4$, $C_2H_2$, $C_2H_4$, $C_3H_6$, or the like) as an example, the gas is not limited thereto. For example, aromatic hydrocarbon such as $C_7H_8$ or the like, or $C_xH_y$ (where x=1 or more and 10 or less and y=2 or more) may be used.

Although the precursor for forming the second film 222 has been described using $Ru_3(CO)_{12}$ as an example, the precursor is not limited thereto. As the Ru-containing gas, for example, (2,4 dimethylpentadienyl) (ethylcyclopentadienyl) ruthenium: (Ru(DMPD) (EtCp)), bis(2,4-dimethylpentadienyl) ruthenium: $(Ru(DMPD)_2)$, (4-dimethylpentadienyl) (methylcyclopentadienyl) ruthenium: (Ru(DMPD) (MeCp)), bis(cyclopentadienyl) ruthenium: $(Ru(C_5H_5)_2)$, or cis-dicarbonyl bis(5-methylhexane-2,4-dionate) ruthenium (I): $Ru(DMBD)(CO)_3$ may be used. Further, the Ru-containing gas may include impurities (for example, P). When a residue remains due to the impurities (for example, P) contained in the Ru-containing gas after the ashing process (S5), a cleaning process may be added in addition to the ashing process with $O_2$. In the cleaning process, the residue is removed by $O_2$ plasma by supplying, for example, $ClF_3$ and $O_3$, as gases. Further, a processing with H plasma may be performed.

Although the embodiment of the substrate processing system 100 has been described above, the present disclosure is not limited to the aforementioned embodiment, and various modifications and variations may be made within the range of the spirit of the present disclosure described in the accompanying claims.

The substrate processing system 100 is not particularly limited, and may be an insitu system which transfers the substrate W in a vacuum atmosphere, or may be an exsitu system which transfers the substrate W in an atmospheric atmosphere.

Although the hard mask forming device 101 has been described as forming the first film 221 and the second film 222 in a single process vessel 20, the present disclosure is not limited thereto, and a process vessel for forming the first film 221 and a process vessel for forming the second film 222 may be separately provided.

Furthermore, the hard mask 220 has been described as being formed by alternately stacking the carbon film (first film 221) having a compressive stress and the Ru film (second film 222) having a tensile stress, but is not limited thereto. A first source gas (carbon-containing gas) that gives a compressive stress to the hard mask and a second source gas (Ru-containing gas) that gives a tensile stress to the hard mask may be mixed at a predetermined ratio, and the hard mask may be formed using the source gas mixture. In addition, a concentration ratio of the first source gas in the gas mixture of the first source gas and the second source gas may be 0.1 to 100%. In some embodiments, in view of the material cost, since the Ru-containing gas is more expensive than the carbon-containing gas, the concentration ratio of the second source gas in the gas mixture may be low.

According to the present disclosure in some embodiments, it is possible to provide a stress-adjusted hard mask, a substrate processing method, and a substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A hard mask for etching a target film formed on a substrate, comprising:
   a first film having a stress in a first direction; and
   a second film having a stress in a second direction opposite to the first direction,
   wherein the first film and the second film are alternately stacked one or more times in the hard mask,
   wherein a pattern is formed in the hard mask to pass through the alternately stacked first and second films, and
   wherein the hard mask is disposed on the target film to etch the target film via the pattern.

2. The hard mask of claim 1, wherein an etching selectivity of the hard mask with respect to the target film is greater than 1.

3. The hard mask of claim 1, wherein the first film has a compressive stress, and the second film has a tensile stress.

4. The hard mask of claim 1, wherein the first film is a carbon film, and the second film is a Ru film.

5. The hard mask of claim 4, wherein an uppermost layer film among the alternately stacked first and second films is the first film.

6. The hard mask of claim 3, wherein a lowermost layer film among the alternately stacked first and second films is the first film.

7. The hard mask of claim 1, wherein the first film and the second film are capable of being removed from the substrate by an ashing process with oxygen plasma.

* * * * *